United States Patent
Di Giandomenico et al.

(10) Patent No.: US 7,688,236 B2
(45) Date of Patent: Mar. 30, 2010

(54) INTEGRATED CIRCUIT COMPRISING A PLURALITY OF DIGITAL-TO-ANALOG CONVERTERS, SIGMA-DELTA MODULATOR CIRCUIT, AND METHOD OF CALIBRATING A PLURALITY OF MULTIBIT DIGITAL-TO-ANALOG CONVERTERS

(75) Inventors: Antonio Di Giandomenico, Velden am Woerthersee (AT); Martin Clara, Villach (AT); David San Segundo Bello, Villach (AT); Wolfgang Klatzer, Mittertrixen (AT); Luca Gori, Nimis (IT); Andreas Wiesbauer, Poertschach (AT)

(73) Assignee: Infineon Technologies AG, Neubiberg Ge (DE)

( * ) Notice: Subject to any disclaimer, the term of this patent is extended or adjusted under 35 U.S.C. 154(b) by 218 days.

(21) Appl. No.: 11/865,539

(22) Filed: Oct. 1, 2007

(65) Prior Publication Data

US 2009/0085784 A1    Apr. 2, 2009

(51) Int. Cl.
   *H03M 1/10*    (2006.01)
(52) U.S. Cl. ...................... 341/120; 341/144
(58) Field of Classification Search ................ 341/118, 341/120, 144, 153, 154
   See application file for complete search history.

(56) References Cited

U.S. PATENT DOCUMENTS

| | | | |
|---|---|---|---|
| 4,967,140 A | * | 10/1990 | Groeneveld et al. ......... 341/120 |
| 5,257,026 A | | 10/1993 | Thompson et al. |
| 5,283,578 A | | 2/1994 | Ribner et al. |
| 5,305,004 A | | 4/1994 | Fattaruso |
| 6,411,232 B1 | * | 6/2002 | Miller et al. ................. 341/120 |
| 6,667,703 B1 | * | 12/2003 | Reuveni et al. ............. 341/120 |
| 2002/0140590 A1 | | 10/2002 | Eshraghi et al. |
| 2004/0174285 A1 | | 9/2004 | Radja et al. |
| 2005/0093725 A1 | * | 5/2005 | McDaniel et al. ........... 341/143 |
| 2005/0116851 A1 | * | 6/2005 | Clara et al. ................. 341/144 |
| 2007/0008200 A1 | | 1/2007 | Hsieh et al. |
| 2007/0069931 A1 | | 3/2007 | Hsieh et al. |

OTHER PUBLICATIONS

Falakshahi et al., A 14-bit, 5-MHz Digital to Analog Converter using Multi-Bit Sigma-Delta Modulation, IEEE 1998 Symposium on VLSI Circuits, Digest of Technical Papers, Jun. 1998, pp. 164-165.*
Fornasari et al., On-Line Calibration and Digital Correction of Multi-Bit Sigma-Delta Modulators, IEEE Digest of Technical Papers, 2005 Symposium on VLSI Circuits, Jun. 2005, pp. 184-187.*
Petrie et al., A Background Calibration Technique for Multi-Bit Delta-Sigma Modulators, 2000 IEEE International Symposium on Circuits and Systems, ISCAS 2000, May 2000, vol. 2, pp. 29-32.*
Paton, S., et al., "Linearity Enhancement Techniques in Low OSR, High Clock Rate Multi-bit Continuous-Time Sigma-Delta Modulators," Custom Integrated Circuits Conference, Oct. 2004, pp. 527-530, Proceedings of the IEEE 2004.
Wouter, D., et al., "A Self-Calibration Technique for Monolithic High-Resolution D/A Converters," IEEE Journal of Solid-State Circuits, Dec. 1989, pp. 1517-1522, vol. 24, No. 6, IEEE.

* cited by examiner

*Primary Examiner*—Howard Williams
(74) *Attorney, Agent, or Firm*—Lee & Hayes, PLLC

(57) ABSTRACT

In an integrated circuit including a first multibit digital-to-analog converter and a second multibit digital-to-analog converter, a calibration circuit is provided which is shared between the first and second digital-to-analog converters.

24 Claims, 5 Drawing Sheets

FIG 3

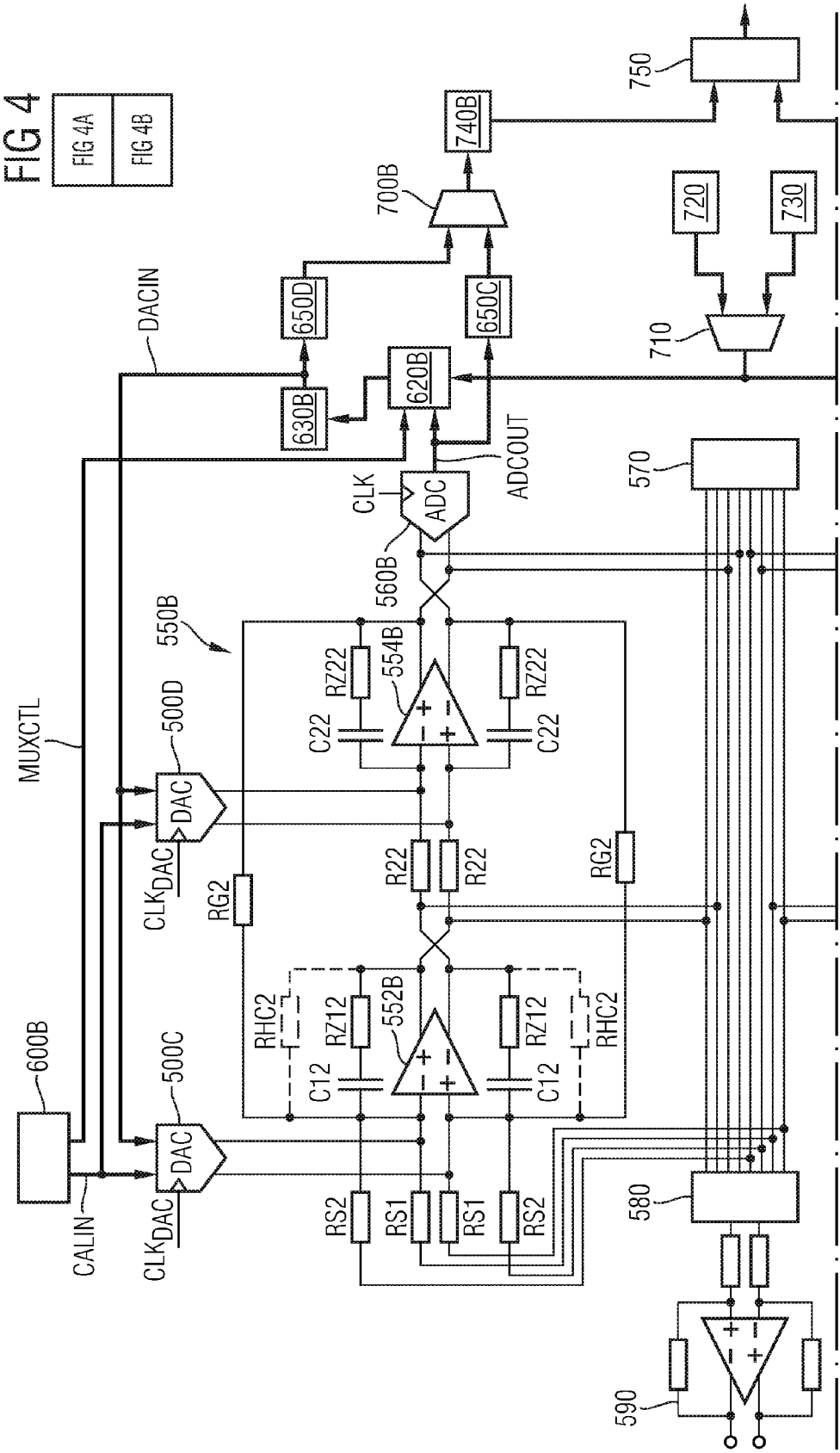

US 7,688,236 B2

INTEGRATED CIRCUIT COMPRISING A PLURALITY OF DIGITAL-TO-ANALOG CONVERTERS, SIGMA-DELTA MODULATOR CIRCUIT, AND METHOD OF CALIBRATING A PLURALITY OF MULTIBIT DIGITAL-TO-ANALOG CONVERTERS

TECHNICAL FIELD

Embodiments of the present invention relate to an integrated circuit with a plurality of digital-to-analog converters, to a sigma-delta modulator circuit, and to a method of calibrating a plurality of multibit digital-to-analog converters.

BACKGROUND

For some applications, high linearity of multibit-analog converters is essential. For example, sigma-delta modulator circuits, e.g. as used in communication applications for analog-to-digital conversion, benefit from a high linearity of a digital-to-analog converter used in the feedback loop of the sigma-delta modulator circuit.

To improve linearity of the digital-to-analog converters, it is known to use dynamic-element-matching techniques or to provide the digital-to-analog converters with a self-calibration function.

In some applications, a plurality of multibit digital-to-analog converters are provided in an integrated circuit. For example, in multifeedback sigma-delta modulators, a first digital-to-analog converter and a second digital-to-analog converter are used to supply analog feedback signals to different feedback nodes. In this case, the use of dynamic element matching techniques may lead to an increased excess loop delay of the sigma-delta modulator circuit. Further, the use of self-calibrated digital-to-analog converters results in increased chip area requirements and power consumption.

SUMMARY OF THE INVENTION

According to one embodiment of the invention, a calibration circuit is provided which is shared between a first multibit digital-to-analog converter and a second multibit digital-to-analog converter.

BRIEF DESCRIPTION OF THE DRAWINGS

For a more complete understanding of embodiments of the present invention, and the advantages thereof, reference is now made to the following descriptions taken in conjunction with the accompanying drawings, in which:

FIG. 3 illustrates exemplary signal values in a sigma-delta modulator as illustrated in FIG. 1.

DETAILED DESCRIPTION OF ILLUSTRATIVE EMBODIMENTS

In the following, the present invention will be further explained by referring to exemplary embodiments and to the accompanying drawings. The description is not to be taken in a limiting sense, but is made only for the purpose of illustrating the general principles of the invention. It is to be understood that the scope of the invention is only defined by the claims and is not intended to be limited by the exemplary embodiments described hereinafter.

Further, it is to be understood that in the following detailed description of exemplary embodiments any shown or described direct connection or coupling between two functional blocks, devices, components, or other physical or functional units could also be implemented by indirect connection or coupling.

The embodiments described hereinafter relate to an integrated circuit comprising a sigma-delta modulator circuit and is typically used in communication applications for digital-to-analog conversion of communication data and to a corresponding calibration method. The communication data may be transmitted via a wireless connection or via a wired connection. In the illustrated embodiments, the sigma-delta modulator circuit is of the continuous-time type. In other embodiments, other types of sigma-delta modulator circuits may be used, e.g., of the switched-capacitor type. Further, it is to be understood that the concepts described hereinafter may also be applied to other types of integrated circuits comprising at least two multibit digital-to-analog converters.

Figure 1:
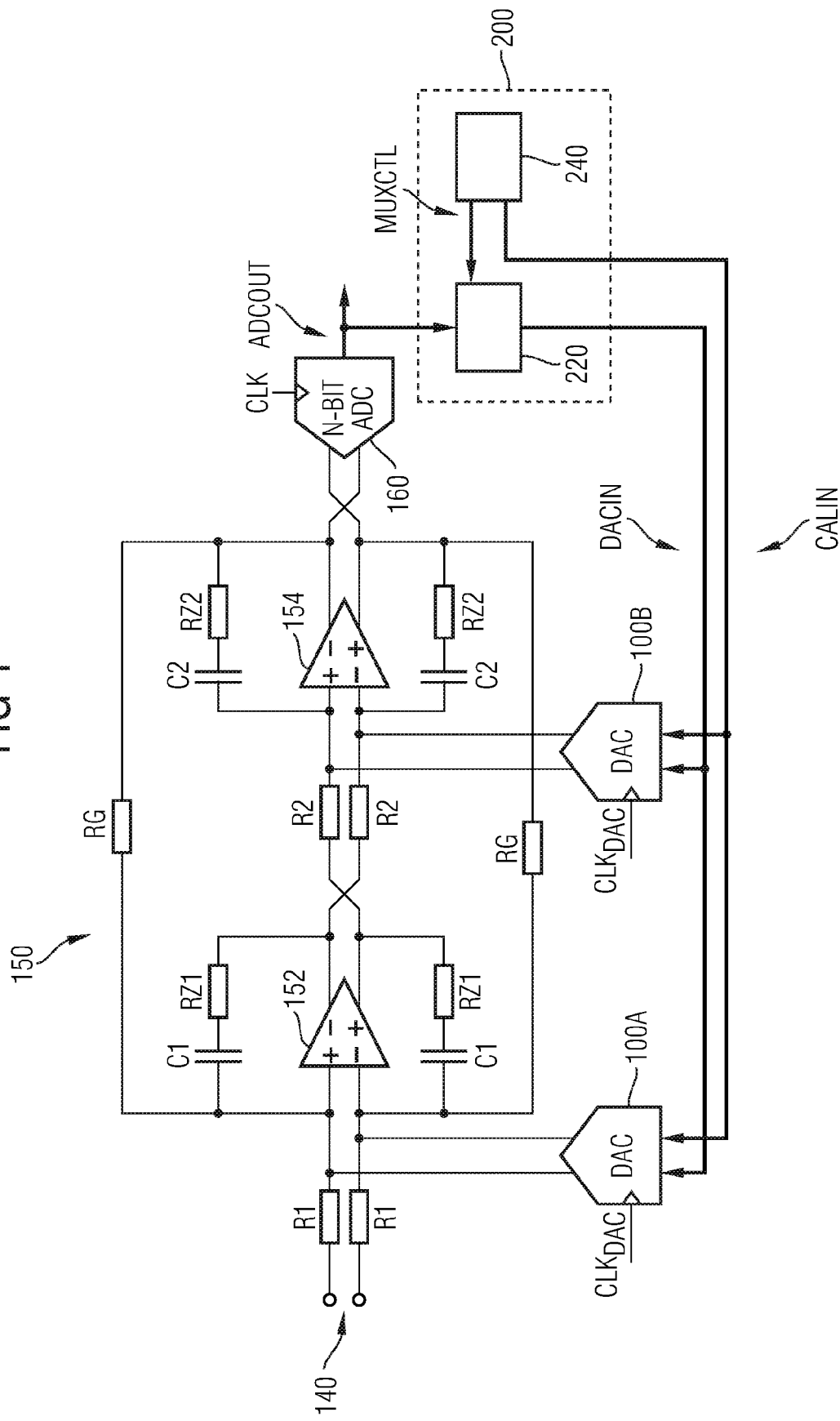
FIG. 1 schematically illustrates a sigma-delta modulator circuit according to an embodiment of the invention.

FIG. 1 schematically illustrates a multifeedback sigma-delta modulator circuit of the continuous-time type. As illustrated, the sigma-delta modulator circuit comprises an analog input 140, a filter network 150, an N-bit analog-to-digital converter (ADC) 160, and feedback loops comprising a first digital-to-analog converter (DAC) 100A and a second DAC 100B. The ADC 160 is of the multibit type, i.e., N>1. Similarly, the first DAC 100A and the second DAC 100B are of the multibit type. The first DAC 100A and the second DAC 100B have the same number of bits as the ADC 160. The purpose of the first DAC 100A and the second DAC 100B is to feedback a digital output signal of the ADC 160 into feedback nodes of the filter network 150. That is to say, the first DAC 100A may be located in a first feedback loop, and the second DAC 100B may be located in a second feedback loop. As illustrated, the feedback nodes may be located within the filter network 150 or at an input of the filter network 150. The first DAC 100A and the second DAC 100B may each be implemented on the basis of a plurality of selectively controllable output cells, e.g., current cells, each of the output cells providing an output signal to be added at a signal output of the DAC. The ADC 160 is operated on a basis of a clock signal CLK. The first DAC 100A and the second DAC 100B are operated on the basis of clock signals $CLK_{DAC}$.

The filter network comprises a first integrator with a buffer 152, capacitors C1 and resistors RZ1, and a second integrator with a buffer 154, capacitors C2 and resistors RZ2. The first integrator receives its input signal from the analog input 140 via resistors R1 or receives the output signal of the first integrator via resistors R2. The output signal of the second integrator is supplied to the ADC 160. Further, the input of the first integrator is coupled to the output of the second integrator via resistors RG. It is to be understood that the above implementation of the filter network 150 is merely exemplary. In other embodiments, other types of filter networks may be used. For example, the integrators may be implemented in a different manner. Further, the number of integrators in the filter network 150 may be selected as appropriate.

As further illustrated, the first DAC 100A supplies its output signal to a feedback node at the input of the first integrator, and the second DAC 100B supplies its output signal to a feedback node at the input of the second integrator. In other embodiments, the feedback nodes may be located at different positions.

As further illustrated, the analog portion of the sigma-delta modulator circuit is configured to operate on the basis of differential signals. In other embodiments, the analog portion of the sigma-delta modulator circuit may be configured to operate on the basis of single-ended signals.

According to the illustrated embodiment, the sigma-delta modulator circuit further comprises a calibration circuit 200 for calibrating the first DAC 100A and the second DAC 100B. That is to say, the calibration circuit 200 is shared between the first DAC 100A and the second DAC 100B.

The calibration circuit 200 supplies a calibration input signal CALIN to the first DAC 100A and to the second DAC 100B. The calibration input signal CALIN is used within the first DAC 100A and the second DAC 100B to select at least one of a plurality of output cells for calibration. This is accomplished in a continuous manner during normal operation of the first DAC 100A and the second DAC 100B.

Further, the calibration circuit 200 receives the output signal ADCOUT of the ADC 160 and generates a data input signal DACIN for the first DAC 100A and for the second DAC 100B on the basis of the output signal ADCOUT of the ADC. The data input signal DACIN is used within the first DAC 100A and the second DAC 100B to control the output cells according to an encoded digital value.

According to the illustrated embodiment, those of the output cells, which are not selected for calibration, are selected to be controlled according to the encoded digital value. For example, if at a given point in time one of the output cells of the first DAC 100A and one of the output cells of the second DAC 100B is selected for calibration, the other output cells may be controlled according to the encoded digital value. For this purpose, the number of output cells of the first DAC 100A and of the second DAC 100B is larger than the number of output cells actually necessary for the mere conversion of the encoded digital values. For example, the first DAC 100A and the second DAC 100B may each comprise 16 output cells, each providing a unity output signal to be added at the signal output of the DAC. Only fifteen output cells are necessary for generating an output signal having 16 different levels, including an output level of zero. Accordingly, one of the output cells is available for calibration. In each clock cycle, a different one of the output cells is selected for calibration. The data input signal DACIN of the first DAC 100A and the second DAC 100B is generated in such a way that the output cell selected for calibration is not controlled by the data input signal DACIN. This structure allows for calibrating the DAC 100A, 100B during normal conversion operation.

The N-bit output signal ADCOUT of the ADC 160 may be supplied to the calibration circuit 200 using $2^N-1$ lines in thermometer coding. As there is one additional output cell to be controlled in the first DAC 100A and one additional output cell to be controlled in the second DAC 100B, the data input signal DACIN is then supplied to the DACs 100A and 100B via $2^N$ lines, using a thermometer coding as well. In other embodiments, a weighted binary coding may be used. Further, an even larger number of output cells may be provided in the first DAC 100A and in the second DAC 100B. In this case, more of the output cells could be calibrated simultaneously, or output cells could be used as spare cells.

According to the illustrated embodiment, the calibration circuit 200 comprises a data multiplexer 220 and a control circuit 240 implemented on the basis of a finite-state machine. The data multiplexer 220 accomplishes the above-mentioned generation of the data input signal DACIN for the first DAC 100A and the second DAC 100B on the basis of the digital value encoded by the output signal ADCOUT of the ADC 160. The control circuit 240 generates the calibration input signal CALIN. Further, the control circuit 240 generates a control signal MUXCTL for controlling the data multiplexer 220.

According to an embodiment, the calibration input signal CALIN comprises a number of switching signals which corresponds to the number of output cells in the first DAC 100A and to the number of output cells in the second DAC 100B, which is used to switch a corresponding output cell into a calibration mode. Similarly, the control signal MUXCTL for the data multiplexer may comprise a number of switching signals which corresponds to the number of lines used for supplying the data input signal DACIN from the data multiplexer 220 to the first DAC 100A and to the second DAC 100B.

The control circuit 240 and/or the finite-state machine may be implemented in hardware, in software, or in a combination thereof.

Figure 2:
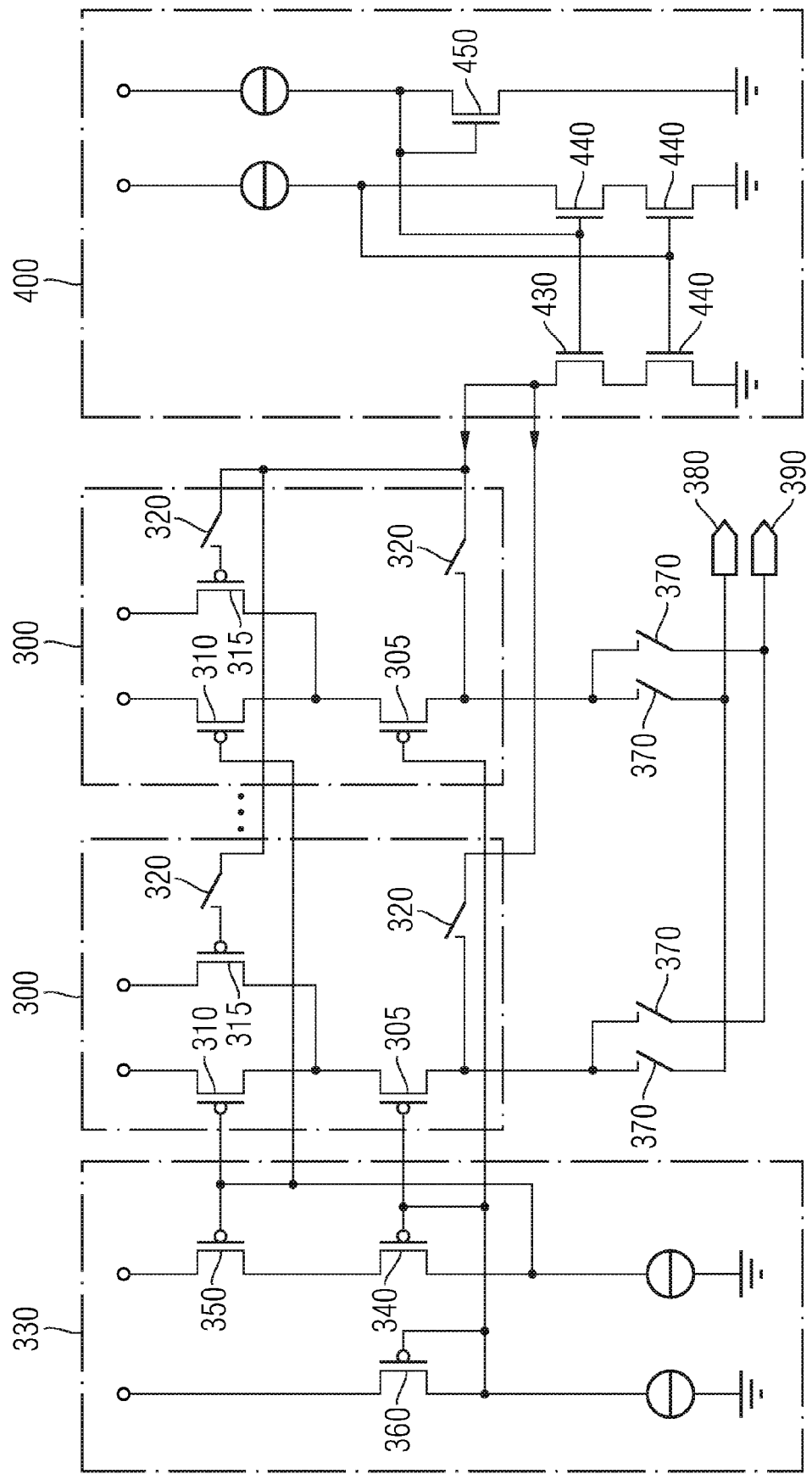
FIG. 2 schematically illustrates circuit components of a calibrated digital-to-analog converter in a sigma-delta modulator according to an embodiment of the invention.

FIG. 2 schematically illustrates internal circuit components of a DAC, e.g., the first DAC 100A or the second DAC 100B, as used in an integrated circuit according to an embodiment of the invention. According to the illustrated embodiment, the DAC comprises a plurality of output cells 300 which are implemented as current cells each providing a unity output current. According to the illustrated embodiment, the number of output cells 300 for an N-bit DAC is $2^N$. The output cells are implemented on the basis of current mirrors with respect to a current-source block 330. As illustrated, the current-source block 330 comprises transistors 340, 350, 360 which are configured to form a current mirror with transistors 305, 310, 315 in each of the output cells 300. In the illustrated embodiment, the current mirrors are implemented on the basis of PMOS transistors. In other embodiments, other types of transistors may be used.

In each of the output cells 300, transistor 310 functions as a mirror transistor which mirrors the current through the transistors 340, 350 of the current-source block 330. The transistor 305 functions as a cascode transistor provided between an output node of the output cell 300 and the mirror transistor 310 so as to form a cascode structure. The transistor 315 functions as a calibration transistor and is connected in parallel to the mirror transistor 310.

The respective output nodes of the output cells 300 are coupled to a differential signal output of the DAC via respective switches 370. That is to say, by means of the switches 370, each of the output cells 300 may be coupled to the differential output of the DAC so as to output a unity current. The output signal of the DAC is then formed by the sum of the individual unity currents. The total value of the output signal may be controlled to one of $2^N$ different levels using the switches 370.

As further illustrated the DAC comprises a calibration source 400, and each of the output cells 300 comprises switches 320 for coupling the output cell 300 to the calibration source 400. The calibration source 400 may be implemented on the basis of current mirrors as well. In the illustrated embodiment, the calibration source 400 comprises NMOS transistors 430, 440, 450. In other embodiments, other types of transistors or other implementations of the calibration source 400 may be used.

The operation of the DAC having the above circuit components is as follows: In normal operation of the DAC, $2^N-1$ of the output cells 300 are used for generating the output signal of the DAC, i.e., selectively supply a unity current to the differential output 380, 390, as controlled by the switches 370. The remaining one of the output cells 300 is selected for calibration and coupled to the calibration source 400 using the switches 320. In this calibration mode of the output cell 300, the respective switches 320 are closed. In this configuration, the calibration transistor 315 is connected so as to operate substantially as a diode, i.e., the drain terminal of the calibration transistor 315 is coupled to the gate terminal of the calibration transistor 315 via the cascode transistor 305. In this state, the current through the output cell 300 is adjusted to a value which corresponds to a calibration current supplied by the calibration source 400. After the switches 320 are opened, the adjusted current value is maintained in normal operation of the output cell 300, as the gate-source capacity of the calibration transistor 315 maintains a gate voltage of the calibration transistor 315 at a substantially constant value until the output cell 300 is again selected for calibration.

The output cells 300 are selected for calibration in a cyclic manner, thereby cyclically adjusting the unity current of the output cells 300 so as to substantially correspond to the calibration current provided by the calibration source 400. In this way, each of the output cells 300 substantially provide the same unity current, irrespective of the mismatch of the transistors used in the output cells 300. This in turn improves the linearity of the DAC.

The switches 320 of the output cells 300 are controlled by the calibration input signal CALIN as explained in connection with FIG. 1. The switches 370 are controlled by the data input signal DACIN as explained with connection with FIG. 1. The switches 320 and 370 may be implemented using transistors or other suitable switching devices.

Figure 3:
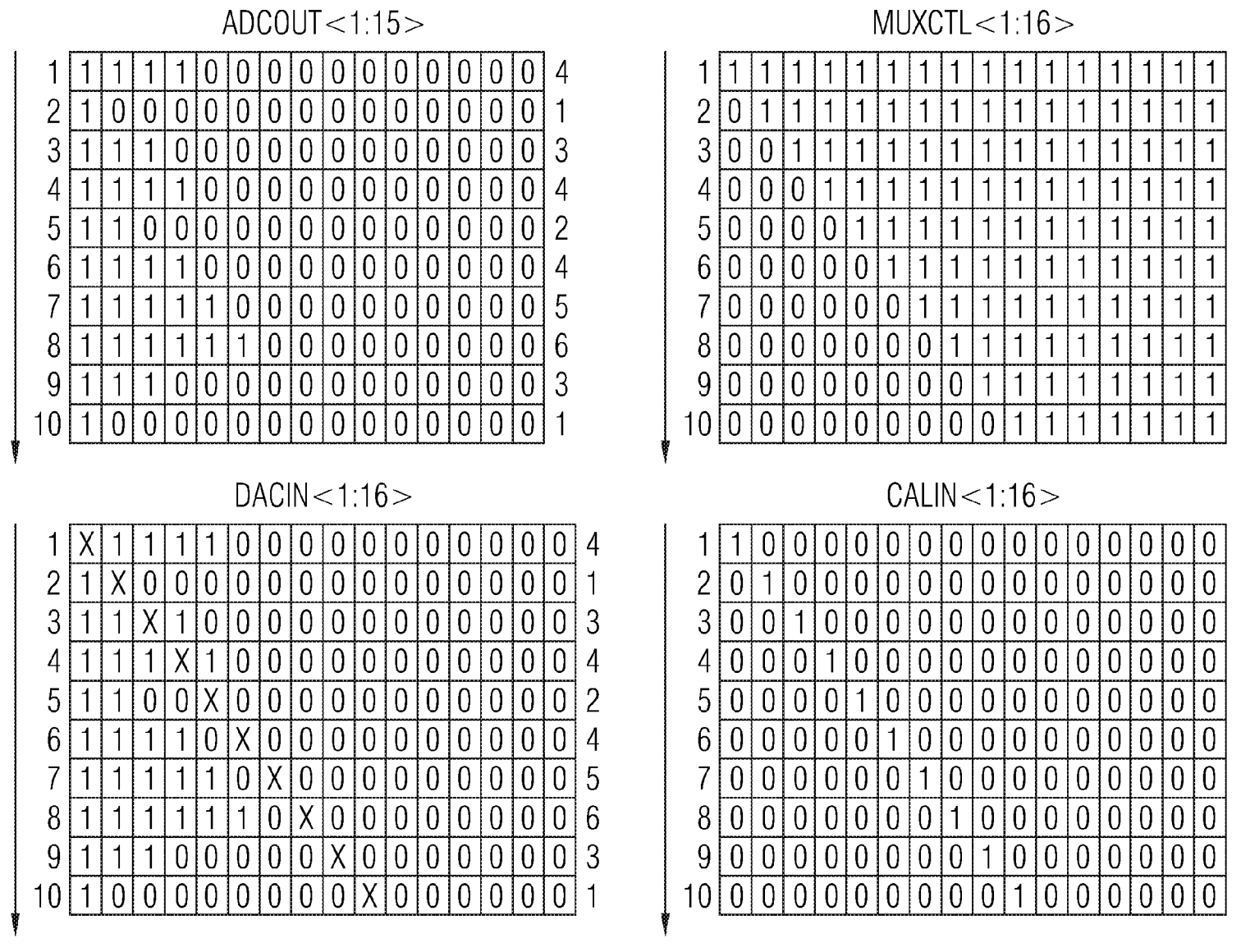

FIG. 3 illustrates exemplary values of the signals ADCOUT, DACIN, MUXCTL, and CALIN as explained in connection with FIG. 1. The exemplary values of FIG. 3 refer to an implementation, in which the number of bits of the ADC 160 and the number of bits of the first DAC 100A and of the second DAC 100B is N=4. The output signal ADCOUT of the ADC 160 is thus represented in thermometer coding by 15 data lines.

In the upper left section of FIG. 3, exemplary values of the signal ADCOUT are illustrated in the form of a table. Each column of the table corresponds to a different data line, and the different rows of the table correspond to different clock cycles of the ADC 160. On the left side of the table, a clock cycle number is given which increases in the direction of the vertical arrow. On the right side of the table, the digital value encoded by the respective row of the table is given in decimal format. As illustrated, an increasing number of the data lines is brought into an active state as the encoded digital value increases.

In the lower left section of FIG. 3, the corresponding values of the data input signal DACIN are illustrated in the form of a similar table. Again, the number of the clock cycles is given on the left side of the table, and the encoded digital value is given on the right side of the table. As illustrated, there is one more data line for the signal DACIN than for the signal ADCOUT. This is due to the fact that the signal DACIN accommodates for one of the output cells of the DAC being selected for calibration and therefore not being available for generating the output signal of the DAC. In FIG. 3, the position of the data line corresponding to the output cell selected for calibration is marked by "X". Up to the position marked by "X", the signal DACIN corresponds to the signal ADCOUT. From the position marked by "X", the n-th data line of the signal ADCOUT corresponds to the (n+1)-th data line of the signal DACIN. In this way, the signal DACIN contains the same information with respect to the encoded digital value as the signal ADCOUT. In other embodiments, different relations between the signal ADCOUT and DACIN may be used.

In the upper right section of FIG. 3, the corresponding values of the signal MUXCTL are illustrated in the form of a similar table. Again, the number of the clock cycle is given on the left side of the table. The signal MUXCTL comprises a data line for each of the data lines of the signal DACIN. In the illustrated example, the signal MUXCTL is generated, starting with all data lines activated at the first clock cycle, by successively deactivating one of the data lines in the next clock cycle, proceeding from left to right. This results in the signal ADCOUT being converted to the signal DACIN by the data multiplexer 220 as explained above. In other embodiments, the signal MUXCTL may be generated in a different manner, depending on the configuration of the data multiplexer 220. If eventually all data lines are deactivated, all output cells have been calibrated, and the procedure restarts with all data lines of the signal MUXCTL activated.

In the lower right section, the corresponding values of the signal CALIN are illustrated. As can be seen, the signal CALIN comprises one data line for each of the data lines of the signal DACIN, i.e., one data line for each of the output cells of the DAC. The data line corresponding to the output cell to be calibrated is active, the other data lines being inactive. In the first clock cycle, the first data line is active. Then the active data line is shifted by one position to the right with each clock cycle. This results in that output cell being selected for calibration which corresponds to the position marked by "X" in the table illustrating the data input signal DACIN.

It is to be understood, that the above values of the signal ADCOUT, DACIN, MUXCTL, and CALIN are merely exemplary. In particular, the selection of the output cell to be calibrated may be accomplished according to a different pattern. In some embodiments, it is even possible to select the output cell to be calibrated in a random manner. As will be understood by the skilled person, the generation of the signal MUXCTL to control the data multiplexer 220 would then need to be adopted accordingly.

Figure 4B:
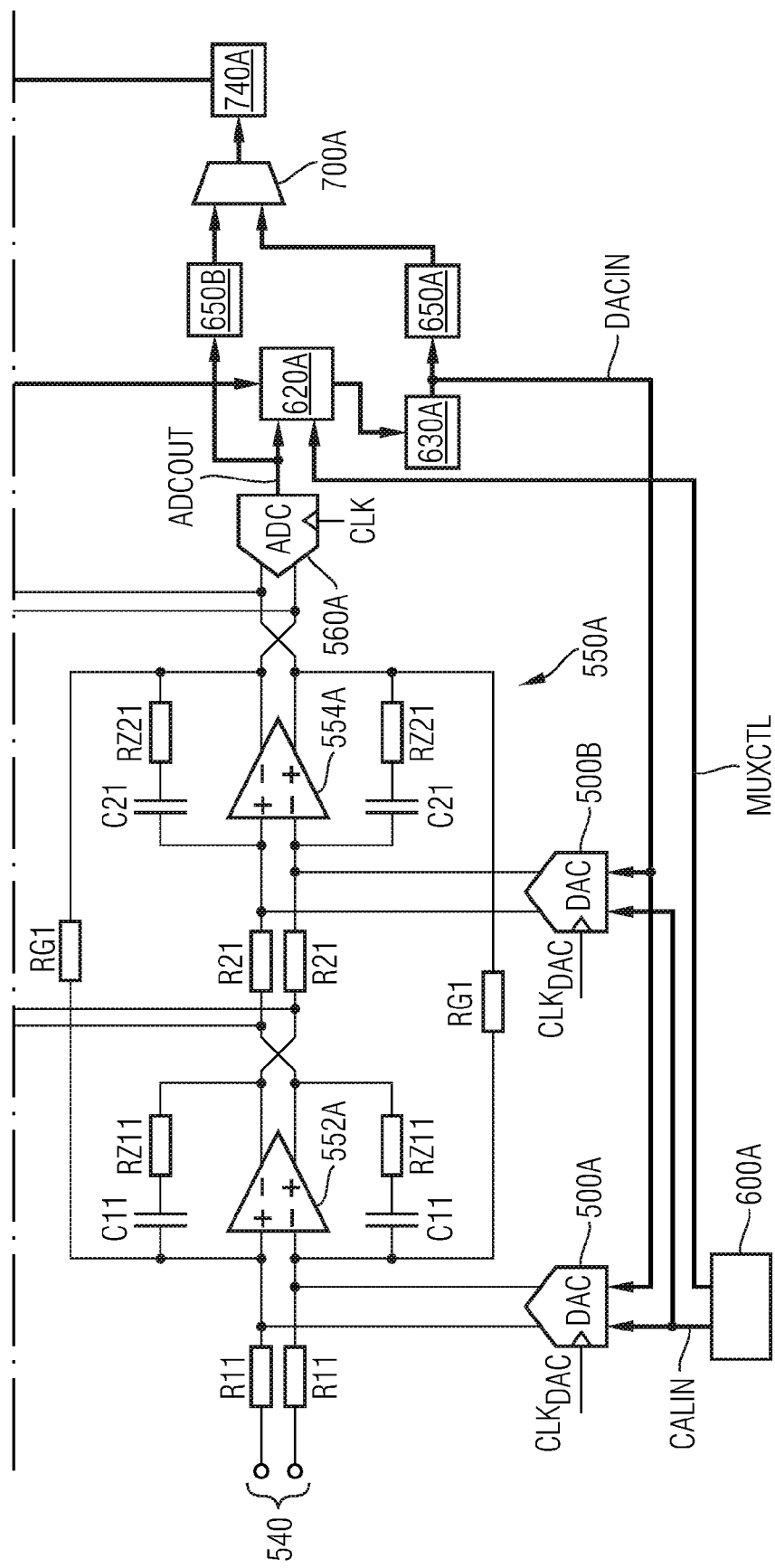
FIG. 4 schematically illustrates a multi-stage sigma-delta modulator circuit according to a further embodiment of the invention.

FIG. 4 schematically illustrates an integrated multifeedback sigma-delta modulator circuit according to a further embodiment of the invention. Again, the sigma-delta modulator circuit is of the continuous-time type. However, according to other embodiments different implementations are possible as well, e.g., a switched-capacitor implementation.

As compared to the sigma-delta modulator circuit of FIG. 1, the sigma-delta modulator circuit of FIG. 4 is of the multi-stage type, e.g., the MASH type. A first modulator stage is generally illustrated in the lower part of FIG. 4. A second modulator stage is generally illustrated in the upper part of FIG. 4.

An analog signal input 540 is coupled to a filter network 550A of the first modulator stage via resistors R11. An output signal of the filter network 550A is supplied to an ADC 560A of the first modulator stage. Feedback loops are provided for feedback of an output signal ADCOUT of the ADC 560A to feedback nodes of the filter network 550A. For this purpose, a first DAC 500A and a second DAC 500B are provided in the first modulator stage.

The feedback loop 550A comprises a first integrator with a first buffer 552A, capacitors C11 and resistors RZ11, and a second integrator comprising a second buffer 554A, capacitors C21 and resistors RZ21. An output signal of the first integrator is supplied to the second integrator via resistors R21. Further, resistors RG1 are provided which couple the input of the first integrator to the output of the second integrator. It is to be understood, that the implementation of the filter network 550A is merely exemplary and that in other embodiments other implementations of the filter network may be used.

In the illustrated embodiment, an output signal of the first DAC 500A is supplied to a feedback node at the input of the first integrator, and an output signal of the second DAC 500B is supplied to a feedback node at the input of the second integrator of the filter network 550A. In other embodiments, the feedback nodes may be located at different positions.

Similar to the first modulator stage, the second modulator stage comprises a filter network 550B and an ADC 560B coupled to receive an output signal of the filter network 550B. Further, the second modulator stage comprises feedback loops for feedback of an output signal ADCOUT of the ADC 560B to feedback nodes of the filter network 550B. The feedback loops comprise a first DAC 500C and a second DAC 500D of the second modulator stage.

The filter network 550B of the second modulator stage comprises a first integrator with a first buffer 552B, capacitors C12 and resistors RZ12, and a second integrator with a second buffer 554B, capacitors C22 and resistors RZ22. As further illustrated by dotted lines, the first integrator may also comprise additional resistors RHC2. An output signal of the first integrator is supplied to the second integrator via resistor R22. Further, an input of the first integrator is coupled to an output of the second integrator via resistors RG2.

An output signal of the first DAC 500C is supplied to a feedback node at the input of the first integrator of the filter network 550B, and an output signal of the second DAC 500D is supplied to a feedback node at the input of the second integrator of the filter network 550B. In other embodiments, the feedback nodes may be positioned in a different manner or the filter network 550B may be implemented in a different manner.

The coupling between the first modulator stage and the second modulator stage is as follows: An output signal of the first integrator of the filter network 550A in the first modulator stage is supplied to the input of the first integrator of the filter network 550B in the second modulator stage via resistors RS1. An output signal of the second integrator of the filter network 550A in the first modulator stage is supplied to the input of the first integrator of the filter network 550B in the second modulator stage via resistors RS2. In other embodiments, the coupling between the first modulator stage and the second modulator stage may be accomplished in a different manner.

The analog portions of the first modulator stage and of the second modulator stage are implemented on the basis of differential signals. In other embodiments, the analog portions of the first modulator stage and of the second modulator stage could be implemented on the basis of signal-ended signals.

The DAC 500A, the DAC 500B, the DAC 500C, and the DAC 500D may be implemented in a similar way as explained in connection with FIG. 2. In particular, each DAC 500A, 500B, 500C, 500D may comprise a plurality of output cells controlled on the basis of a data input signal. The output cells may be implemented as current cells.

The ADC 560A and the ADC 560B are each supplied with a clock signal CLK. The DACs 500A, 500B, 500C, 500D are supplied with clock signals $CLK_{DAC}$.

As further illustrated, the sigma-delta modulator circuit comprises an overload block 570 and an analog multiplexer 580 coupled to the outputs of the first integrator and of the second integrator of the filter network 550A in the first modulator stage and to the outputs of the first integrator and of the second integrator of the filter network 550B in the second modulator stage. An analog measurement output buffer 590 is coupled to the analog multiplexer 580. These structures are provided for monitoring and overload management purposes.

Further, the sigma-delta modulator circuit comprises a first data multiplexer 620A coupled to receive the output signal ADCOUT of the ADC 560A of the first modulator stage, and a second data multiplexer 620B coupled to receive the output signal ADCOUT of the ADC 560B of the second modulator stage. The data multiplexers 620A, 620B operate as explained for the data multiplexer 220 of FIG. 1. In particular, the data multiplexer 620A selects output cells of the first DAC 500A and of the second DAC 500B to be controlled to generate the output signal of the DAC according to the digital value encoded by the output signal ADCOUT of the ADC 560A. The data multiplexer 620B selects output cells of the first DAC 500C and of the second DAC 500D of the second modulator stage to be controlled to generate the output signal of the DAC according to the digital value encoded by the output signal ADCOUT of the ADC 560B of the second modulator stage.

The sigma-delta modulator circuit further includes a first control circuit 600A of the first modulator stage and a second control circuit 600B of the second modulator stage. The finite-stage machines 600A, 600B each have a similar function as the control circuit 240 of FIG. 2. In particular, the first control circuit 600A generates a calibration input signal CALIN to be supplied to the first DAC 500A and to the second DAC 500B of the first modulator stage so as to select one of a plurality of output cells of the DAC for calibration. Further, the control circuit 600A generates a control signal MUXCTL for the data multiplexer 620A of the first modulator stage. As explained above in connection with FIG. 3, the signals CALIN and MUXCTL are generated in such a way that in each clock cycle, a different output cell of the DAC is selected for calibration and that the remaining output cells are used for generating the output signal of the DAC on the basis of the digital value encoded by the output signal ADCOUT of the ADC 560A of the first modulator stage.

Similarly, the second control circuit 600B generates a calibration input signal CALIN to be supplied to the first DAC 500C and to the second DAC 500D of the second modulator stage so as to select one of a plurality of output cells of the DAC for calibration. Further, the control circuit 600B generates a control signal MUXCTL for the second data multiplexer 620B. As explained above, the signals CALIN and MUXCTL are generated in such a way that in each clock cycle a different one of the output cells of the DAC is selected for calibration and that the remaining output cells of the DAC are used for generating the output signal of the DAC according to the digital value encoded by the output signal ADCOUT of the ADC 560B of the second modulator stage.

Similar to the embodiment of FIG. 1, the control circuit 600A and the control circuit 600B may be implemented on the basis of a finite-state machine.

According to the illustrated embodiment, a first data input signal DACIN is supplied from the data multiplexer 620A to the DAC 500A and to the DAC 500B via a data latch 630A. Similarly, a second data input signal DACIN is supplied from the data multiplexer 620B to the DAC 500C and to the DAC 500D via a data latch 630B. In other embodiments, the data latches 630A and/or 630B may be omitted.

As further illustrated, the output signal ADCOUT of the ADC 560A of the first modulator stage and an output signal of the data latch 630A of the first modulator stage are supplied to decoders 650A and 650B, respectively. Similarly, the output signal ADCOUT of the ADC 560B of the second modulator stage and the output signal of the data latch 630B of the second modulator stage are supplied to decoders 650C and 650D, respectively. The decoders 650A, 650B, 650C, 650D have the purpose of transforming a thermometer code of their input signal into a binary-weighted code, thereby reducing the number of digital lines for transmitting the signal.

From the decoders 650A, 650B of the first modulator stage, the signal is supplied to a first multiplexer 700A. By means of the first multiplexer 700A, a signal to be further supplied may be selected between the output signal of the decoder 650A and the output signal of the decoder 650B. Similarly, the second modulator stage comprises a second multiplexer 700B coupled to receive the output signal of the decoder 650C and of the decoder 650D. By means of the second multiplexer 700B, a signal to be further transmitted may be selected between the output signal of the decoder 650C and the output signal of the decoder 650D.

An output signal of the multiplexer 700A is supplied to a downrater 740A, and an output signal of the multiplexer 700B is supplied to a downrater 740B. The purpose of the downraters is to reduce the output digital speed by parallelization.

Output signals of the downraters 740A, 740B are supplied to a low-voltage differential signal interface 750 which is used to output digital data with low signal swings.

As further illustrated, the sigma-delta modulator circuit comprises a multiplexer 710, a chip control interface 720 to store control programming information, and a linear-feedback shift register 730 to generate a pseudo-random digital signal. The pseudo-random digital signal can be supplied to the feedback loops of the first modulator stage and/or of the second modulator stage via the multiplexer 710, for analyzing or tuning the properties of the feedback loops.

In the embodiment of FIG. 4, the first control circuit 600A, the first data multiplexer 620A, and the data latch 630A form a calibration circuit shared between the first DAC 500A and the second DAC 500B of the first modulator stage. Similarly, the second control circuit 600B, the second data multiplexer 620B, and the data latch 630B form a calibration circuit shared between the first DAC 500C and the second DAC 500D of the second modulator stage. In other embodiments, it is also possible to use a single control circuit which is shared between the DAC 500A, the DAC 500B, the DAC 500C, and the DAC 500D, i.e., to have a calibration circuit which is shared by all DACs.

It is to be understood that various modifications are possible within the above-mentioned embodiments without departing from the scope of the present invention. For example, the above-mentioned concepts may be used in other integrated circuits than sigma-delta modulator circuits. Further, the concepts may be used in other types of sigma-delta modulator circuits, such as switched-capacitor sigma-delta modulator circuits. Further, different types of calibrated DAC could be used, without limitation to current steering DACs. Depending on the type of DAC, other calibration mechanisms could be used, without limitation to the calibration of output currents as explained in connection with FIG. 2.

Finally, it is to be understood that the features of the above embodiments may be combined with each other as appropriate.

What is claimed is:

1. An integrated circuit comprising:
   a first multibit digital-to-analog converter;
   a second multibit digital-to-analog converter;
   a calibration circuit shared between the first and second digital-to-analog converters;
   a first modulator stage; and
   a second modulator stage, wherein the first digital-to-analog converter is provided in the first modulator stage and the second digital-to-analog converter is provided in the second modulator stage.

2. The integrated circuit according to claim 1, wherein the first and second digital-to-analog converters each comprise a plurality of output cells, and wherein the calibration circuit is configured to control calibration of a respective output signal of the output cells.

3. The integrated circuit of claim 2, wherein the calibration circuit comprises a control circuit configured to supply a calibration input signal to the first and second digital-to-analog converters to select at least one of the output cells for calibration.

4. The integrated circuit of claim 3, wherein the control circuit comprises a finite-state machine.

5. The integrated circuit of claim 3, wherein the calibration circuit comprises a data multiplexer to select output cells of the first and/or second digital-to-analog converters to be controlled on the basis of a data input signal.

6. The integrated circuit of claim 5, wherein the control circuit is configured to generate a control signal of the data multiplexer.

7. The integrated circuit of claim 3, wherein the calibration circuit comprises a first data multiplexer to select output cells of the first digital-to-analog converter to be controlled on the basis of a first data input signal and a second data multiplexer to select output cells of the second digital-to-analog converter to be controlled on the basis of a second data input signal.

8. The integrated circuit of claim 2, wherein the output cells are configured as current cells providing an output current as the output signal.

9. The integrated circuit of claim 1, wherein the first and second digital-to-analog converters are part of a sigma-delta modulator circuit.

10. A sigma-delta modulator circuit, comprising:
    a first multibit digital-to-analog converter;
    a second multibit digital-to-analog converter;
    a calibration circuit shared between the first and second digital-to-analog converters;
    a first feedback loon; and
    a second feedback loon, wherein the first digital-to-analog converter is provided in the first feedback loon and the second digital-to-analog converter is provided in the second feedback loon.

11. The sigma-delta modulator circuit of claim 10, further comprising:
    a first modulator stage; and
    a second modulator stage, wherein the first digital-to-analog converter is provided in the first modulator stage and the second digital-to-analog converter is provided in the second modulator stage.

12. The sigma-delta modulator circuit of claim 10, wherein the first and second digital-to-analog converters each comprise a plurality of output cells, and wherein the calibration circuit is configured to control calibration of a respective output signal of the output cells.

13. The sigma-delta modulator circuit of claim 12, wherein the calibration circuit comprises a control circuit configured to supply a calibration input signal to the first and second digital-to-analog converters to select at least one of the output cells for calibration.

14. The sigma-delta modulator circuit of claim 13, wherein the control circuit comprises a finite-state machine.

15. The sigma-delta modulator circuit of claim 13, wherein the calibration circuit comprises a data multiplexer to select output cells of the first and/or second digital-to-analog converters to be controlled on the basis of a data input signal.

16. The sigma-delta modulator circuit of claim 15, wherein the control circuit is configured to generate a control signal of the data multiplexer.

17. The sigma-delta modulator circuit of claim 13, wherein the calibration circuit comprises a first data multiplexer to select output cells of the first digital-to-analog converter to be controlled on the basis of a first data input signal and a second data multiplexer to select output cells of the second digital-to-analog converter to be controlled on the basis of a second data input signal.

18. The sigma-delta modulator circuit of claim 12, wherein the output cells are configured as current cells providing an output current as the output signal.

19. The sigma-delta modulator circuit of claim 10, wherein the sigma-delta modulator circuit is of a continuous-time type.

20. A method of calibrating a plurality of multibit digital-to-analog converters, the method comprising:

generating a calibration input signal; and supplying the calibration input signal to each of the digital-to-analog converters, each of the digital-to-analog converters are included in their own respective modulator stage.

21. The method according to claim 20, wherein the digital-to-analog converters each comprise a plurality of output cells, and wherein the method comprises controlling calibration of a respective output signal of the output cells.

22. The method according to claim 21, further comprising selecting, by means of the calibration input signal, at least one of the output cells for calibration.

23. The method according to claim 21, further comprising selecting at least two of the output cells to be controlled on the basis of a data input signal.

24. The method according to claim 20, wherein calibration of the digital-to-analog converters is accomplished during normal operation of the digital-to-analog converters.

* * * * *

UNITED STATES PATENT AND TRADEMARK OFFICE
CERTIFICATE OF CORRECTION

PATENT NO. : 7,688,236 B2  Page 1 of 1
APPLICATION NO. : 11/865539
DATED : March 30, 2010
INVENTOR(S) : Antonio Di Giandomenico et al.

It is certified that error appears in the above-identified patent and that said Letters Patent is hereby corrected as shown below:

On Claim 10, change (4 places)

Column 10, lines 42, 43, 44 and 46, change "loon" to -- loop --.

Signed and Sealed this

First Day of June, 2010

David J. Kappos
*Director of the United States Patent and Trademark Office*